United States Patent
Eker et al.

(10) Patent No.: US 12,068,723 B2
(45) Date of Patent: Aug. 20, 2024

(54) DIRECT CURRENT OFFSET COMPENSATION CIRCUIT

(71) Applicant: Cisco Technology, Inc., San Jose, CA (US)

(72) Inventors: Mehmet M. Eker, San Marcos, CA (US); Simon S. Pang, San Diego, CA (US); Joseph J. Balardeta, Encinitas, CA (US)

(73) Assignee: Cisco Technology, Inc., San Jose, CA (US)

( * ) Notice: Subject to any disclaimer, the term of this patent is extended or adjusted under 35 U.S.C. 154(b) by 491 days.

(21) Appl. No.: 17/451,574

(22) Filed: Oct. 20, 2021

(65) Prior Publication Data

US 2023/0122287 A1    Apr. 20, 2023

(51) Int. Cl.
*H03F 3/08*    (2006.01)
*H03F 3/45*    (2006.01)

(52) U.S. Cl.
CPC ......... *H03F 3/087* (2013.01); *H03F 3/45475* (2013.01)

(58) Field of Classification Search
CPC ... H03F 3/087; H03F 3/45475; H03F 3/45968
USPC .................................................. 330/308, 310
See application file for complete search history.

(56) References Cited

U.S. PATENT DOCUMENTS

| | | | |
|---|---|---|---|
| 7,259,627 B1 | 8/2007 | Dhanasekaran et al. | |
| 8,471,639 B2* | 6/2013 | Welch | H03F 3/45071 330/308 |
| 2002/0130696 A1 | 9/2002 | Yoshizawa | |
| 2015/0338274 A1 | 11/2015 | Frank et al. | |
| 2020/0373885 A1 | 11/2020 | Appel et al. | |
| 2023/0053023 A1* | 2/2023 | Zhang | H03F 3/087 |

OTHER PUBLICATIONS

Dongquan Huo, Luhong Mao, Liji Wu, Xiangmin Zhang, "A Linearity Improvement Front End with Subharmonic Current Commutating Passive Mixer for 2.4 GHZ Direct Conversion Receiver in 0.13 mm CCMOS Technology," MDPI, dated Aug. 24, 2020, pp. 1-17.

* cited by examiner

*Primary Examiner* — Hieu P Nguyen
(74) *Attorney, Agent, or Firm* — Patterson + Sheridan, LLP

(57) ABSTRACT

A differential transimpedance amplifier (DTIA) includes a first input, a second input, a first output, and a second output. The DTIA also includes a first inverter and a second inverter connected in series to the first input. The DTIA further includes a third inverter and a fourth inverter connected in series to the second input. The first inverter and the fourth inverter receive a first supply voltage from a first voltage regulator. The second inverter and the third inverter receive a second supply voltage from a second voltage regulator. The first supply voltage changes (i) based on a difference between voltages on the first output and the second output and (ii) while the second supply voltage remains fixed.

20 Claims, 6 Drawing Sheets

DIRECT CURRENT OFFSET COMPENSATION CIRCUIT

TECHNICAL FIELD

Embodiments presented in this disclosure generally relate to differential transimpedance amplifiers (DTIAs). More specifically, embodiments disclosed herein relate to a direct current (DC) offset compensation circuit for DTIAs.

BACKGROUND

DTIAs are used in optical circuits to convert electric currents into voltages over a differential output. In many instances, it is desirable for the differential output signals to be symmetric, but DC offset causes these output signals to be asymmetric. Several DC offset compensation techniques exist, but these techniques involve invasive tapping that reduce the bandwidth or gain of the DTIA.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

According to an embodiment, a DTIA includes a first input, a second input, a first output, and a second output. The DTIA also includes a first inverter and a second inverter connected in series to the first input. The DTIA further includes a third inverter and a fourth inverter connected in series to the second input. The first inverter and the fourth inverter receive a first supply voltage from a first voltage regulator. The second inverter and the third inverter receive a second supply voltage from a second voltage regulator. The first supply voltage changes (i) based on a difference between voltages on the first output and the second output and (ii) while the second supply voltage remains fixed. Other embodiments include a method performed by the DTIA.

According to another embodiment, a DTIA includes a first inverter and a second inverter connected in series. The DTIA also includes a third inverter and a fourth inverter connected in series. The first inverter and the fourth inverter receive a first supply voltage. The second inverter and the third inverter receive a second supply voltage. The first supply voltage changes based on an output voltage of the DTIA while the second supply voltage remains fixed. Other embodiments include a method performed by the DTIA.

Example Embodiments

The present disclosure relates to a differential transimpedance amplifier (DTIA) that includes a direct current (DC) offset compensation circuit that uses a series of inverters to reduce DC offset in the output of the DTIA. Specifically, a digital-to-analog converter (DAC) controlled voltage regulator adjusts the supply voltage to a portion of the inverters in the DC offset compensation circuit to reduce the DC offset at the output. Meanwhile, the supply voltage to other inverters in the DTIA are fixed. As a result, the DC offset in the output of the DTIA is compensated while maintaining the bandwidth or gain of the DTIA, in certain embodiments.

Figure 1:
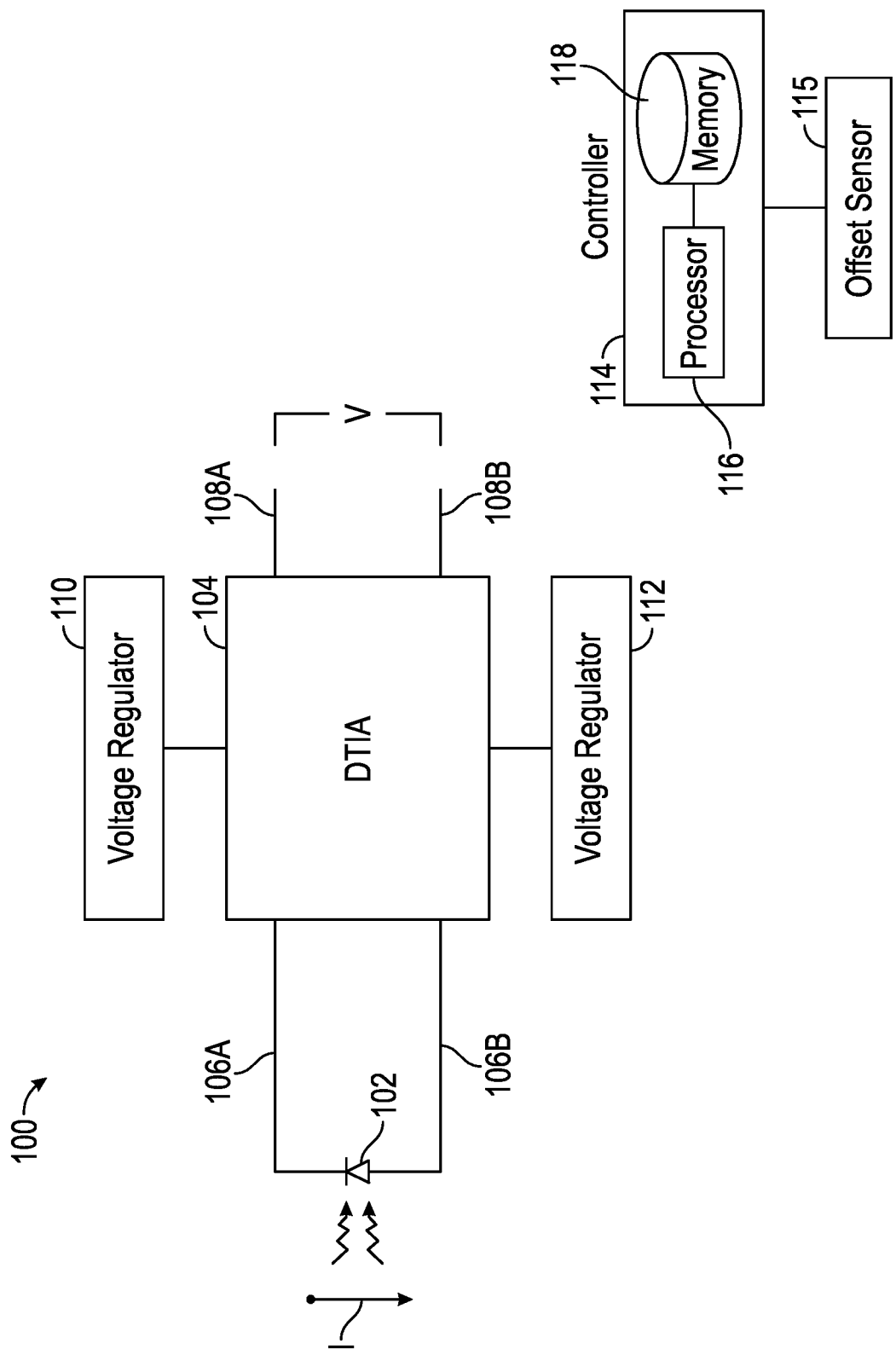
FIG. 1 illustrates an example system.

FIG. 1 illustrates an example system 100. As seen in FIG. 1, the system 100 includes a photodiode 102, a DTIA 104, a voltage regulator 110, a voltage regulator 112, a controller 114, and an offset sensor 115. The DTIA 104 includes a DC offset compensation circuit that compensates or reduces DC offset in an output of the DTIA 104. The voltage regulator 110 adjusts its supply voltage to compensate or reduce the DC offset in the output of the DTIA 104.

The photodiode 102 generates an electric current based on light or other optical signals received by the photodiode 102. For example, when light enters the photodiode 102, the photodiode 102 generates an electric current that flows between the inputs 106A and 106B of the DTIA 104. The magnitude of the electric current may depend on the amount or the intensity of the light that enters the photodiode 102. For example, the more light that enters the photodiode 102, the larger the electric current that the photodiode 102 generates.

The DTIA 104 converts the electrical current flowing between the inputs 106A and 106B into a voltage over outputs 108A and 108B. Generally, the larger the magnitude of the electric current, the larger the magnitude of the electric voltage generated by the DTIA 104. The DTIA 104 includes a DC offset compensation circuit that compensates or reduces a DC offset in the electric voltage over the outputs 108A and 108B.

The voltage regulators 110 and 112 provide supply voltages to the DTIA 104 to power components of the DTIA 104, such as inverters. Some of the inverters are powered by the voltage regulator 110, and some of the inverters are powered by the voltage regulator 112. In certain embodiments, to compensate or reduce the DC offset in the output of the DTIA 104, the supply voltage from the voltage regulator 110 is adjusted while maintaining the supply voltage from the voltage regulator 112. As a result, the supply voltage provided to some of the inverters in the DC offset compensation circuit is adjusted, which reduces the DC offset in the output of the DTIA 104.

The controller 114 controls the voltage regulators 110 and 112 based on the output of the DTIA 104. In some embodiments, the controller 114 adjusts the supply voltages from the voltage regulators 110 and 112 to reduce or compensate a DC offset in the output of the DTIA 104 sensed by the offset sensor 115. The controller 114 may also include analog or digital circuitry that generates a control signal based on the sensed DC offset. The control signal is communicated to the voltage regulator 110 to adjust its supply voltage to reduce or compensate the sensed DC offset. In some embodiments, instead of using the digital or analog circuitry to generate the control signal, the controller 114 includes a processor 116 and a memory 118 that execute a software application to generate the control signal.

The processor 116 is any electronic circuitry, including, but not limited to one or a combination of microprocessors, microcontrollers, application specific integrated circuits (ASIC), application specific instruction set processor (ASIP), and/or state machines, that communicatively couples to memory 118 and controls the operation of the controller 114. The processor 116 may be 8-bit, 16-bit, 32-bit, 64-bit or of any other suitable architecture. The processor 116 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components. The processor 116 may include other hardware that operates software to control and process information. The processor 116 executes software stored on the memory 118 to perform any of the functions described herein. The processor 116 controls the operation and administration of the controller 114 by processing information (e.g., information received from the voltage regulator 110, the DTIA 104, and the memory 118). The processor 116 is not limited to a single processing device and may encompass multiple processing devices.

The memory 118 may store, either permanently or temporarily, data, operational software, or other information for the processor 116. The memory 118 may include any one or a combination of volatile or non-volatile local or remote devices suitable for storing information. For example, the memory 118 may include random access memory (RAM), read only memory (ROM), magnetic storage devices, optical storage devices, or any other suitable information storage device or a combination of these devices. The software represents any suitable set of instructions, logic, or code embodied in a computer-readable storage medium. For example, the software may be embodied in the memory 118, a disk, a CD, or a flash drive. In particular embodiments, the software may include an application executable by the processor 116 to perform one or more of the functions described herein.

Figure 2:
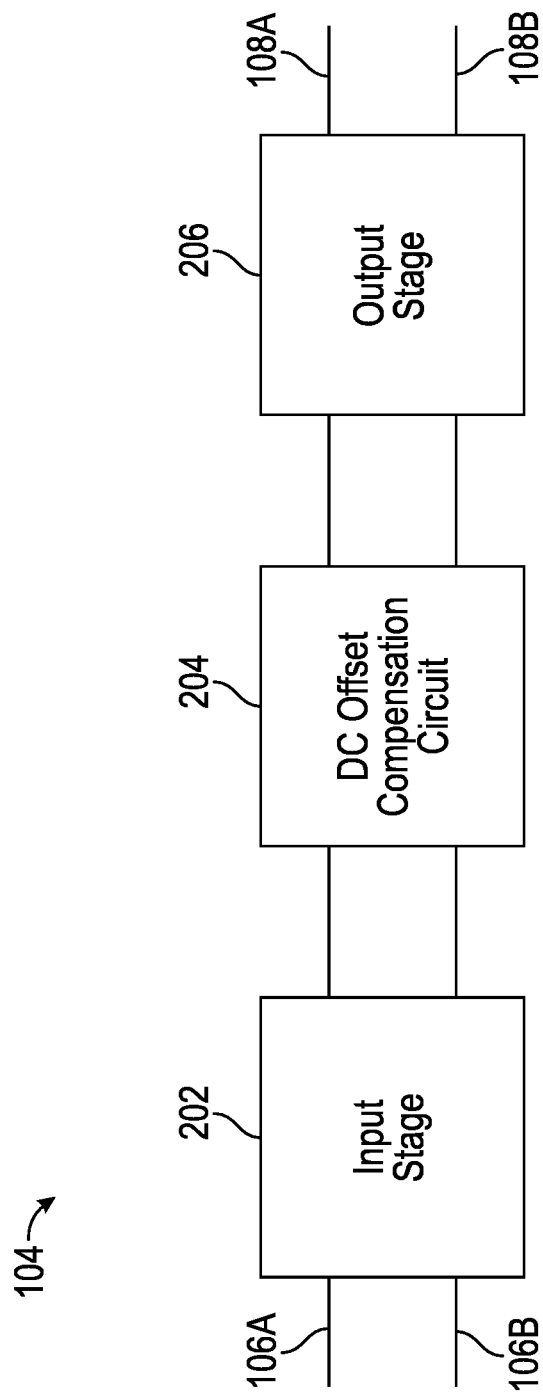
FIG. 2 illustrates an example DTIA of the system of FIG. 1.

FIG. 2 illustrates an example DTIA 104 of the system 100 of FIG. 1. As seen in FIG. 2, the DTIA 104 includes an input stage 202, a DC offset compensation circuit 204 and an output stage 206. The input stage 202 receives the electric current flowing between the inputs 106A and 106B. The DC offset compensation circuit 204 is connected to the output of the input stage 202. The output stage 206 is connected to the output of the DC offset compensation circuit 204 and outputs an electric voltage over the outputs 108A and 108B. Generally, the DC offset compensation circuit 204 reduces or compensates a DC offset in the output voltage of the DTIA 104.

Figure 3:
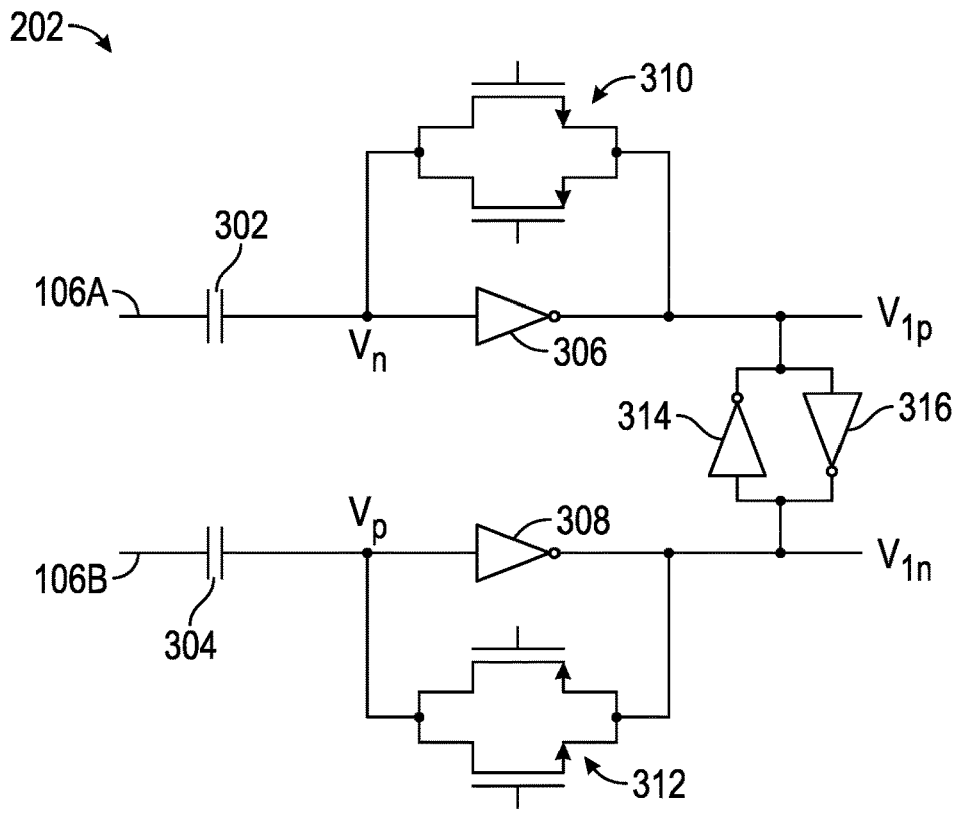
FIG. 3 illustrates an example input stage of the DTIA of FIG. 2.

FIG. 3 illustrates an example input stage 202 of the DTIA 104 of FIG. 2. As seen in FIG. 3, the input stage 202 receives the electric current flowing between the inputs 106A and 106B of the DTIA 104. The input stage 202 includes a capacitor 302 connected to the input 106A and a capacitor 304 connected to the input 106B. Generally, the capacitors 302 and 304 produce a voltage based on the electric current flowing between the inputs 106A and 106B. As seen in FIG. 3, the capacitor 302 provides a voltage labeled $V_n$ and the capacitor 304 provides a voltage labeled $V_p$.

An inverter 306 is connected to the capacitor 302, and an inverter 308 is connected to the capacitor 304. The inverters 306 and 308 invert and apply a gain to the voltage signals from the capacitors 302 and 304. The resulting voltages are labeled $V_{1p}$ and $V_{1n}$ in FIG. 3. Specifically, the inverter 306 produces the voltage $V_{1P}$, and the inverter 308 produces the voltage $V_{1N}$. In certain embodiments, the input stage 202 includes inverters 314 and 316 connected in parallel to each other between the outputs of the input stage 202. The inverter 314 is directed towards the output of the inverter 306, and the inverter 316 is directed towards the output of the inverter 308. Each of the inverters 306, 308, 314 and 316 are powered by the voltage regulator 112 shown in FIG. 1. As a result, the supply voltage provided to the inverters 306, 308, 314 and 316 may be maintained when the DC offset compensation circuit 204 shown in FIG. 2 is reducing or compensating a DC offset over the outputs 108A and 108B of the DTIA 104.

Variable resistors 310 and 312 are connected in parallel to the inverters 306 and 308 and adjust the gains of the inverters 306 and 308. The resistances of these variable resistors 310 and 312 may be controlled by adjusting gate voltages within the variable resistors 310 and 312. By adjusting the resistances of the variable resistors 310 and 312, the gains of the inverters 306 and 308 are adjusted.

Figure 4:
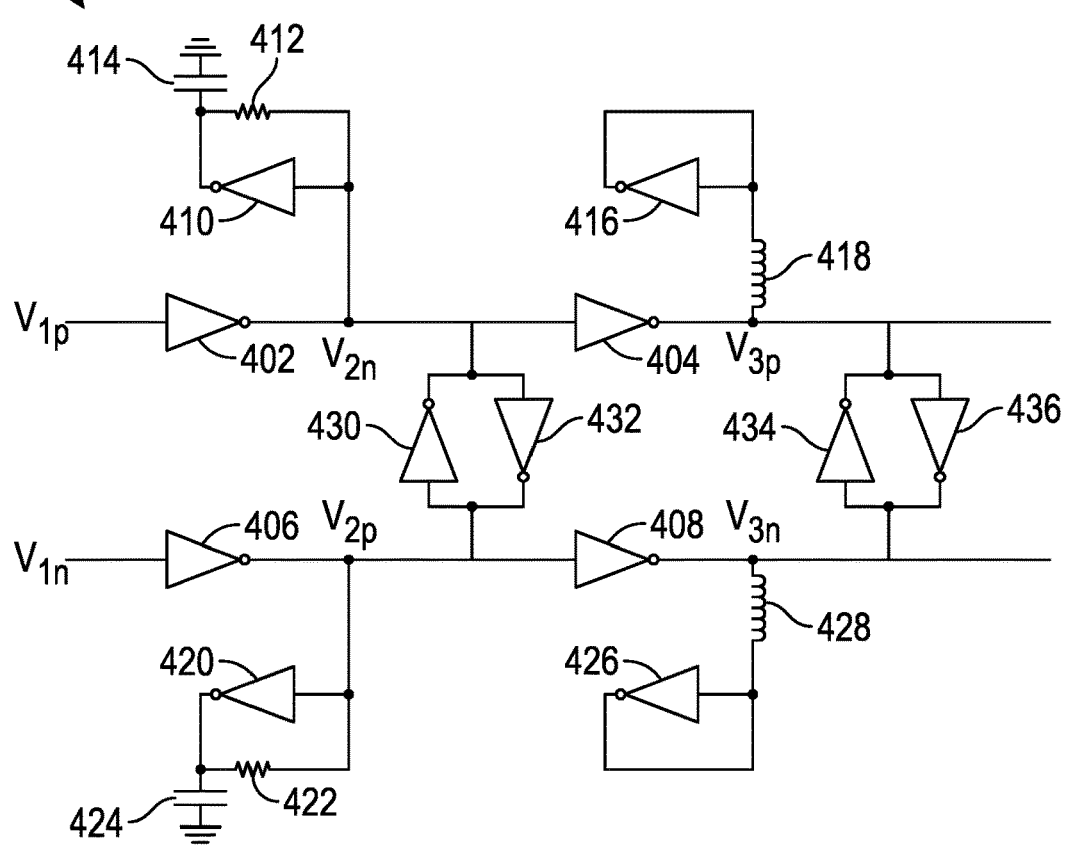
FIG. 4 illustrates an example DC offset compensation circuit in the DTIA of FIG. 2.

FIG. 4 illustrates an example DC offset compensation circuit 204 in the DTIA 104 of FIG. 2. As seen in FIG. 4, the DC offset compensation circuit 204 includes an inverter 402 and an inverter 406 that receive the outputs of the input stage 202. Specifically, the inverter 402 receives $V_{1P}$ from the input stage 202, and the inverter 406 receives $V_{1N}$ from the input stage 202. The inverter 402 inverts and applies a gain to $V_{1P}$ to produce a voltage signal labeled $V_{2N}$ in FIG. 4. The inverter 406 inverts and applies a gain to $V_{1N}$ to produce a voltage signal labeled $V_{2P}$ in FIG. 4. The DC offset compensation circuit 204 also includes inverters 404 and 408 connected in series with the inverters 402 and 406, respectively. The inverter 404 inverts and applies a gain to $V_{2N}$ to produce a voltage signal labeled $V_{3P}$ in FIG. 4. The inverter 408 inverts and applies a gain to $V_{2P}$ to produce a voltage signal labeled $V_{3N}$ in FIG. 4. Mismatches between or amongst the inverters 402, 404, 406, and 408 may cause a DC offset in their outputs.

In certain embodiments, the inverters 402 and 408 are powered by the voltage regulator 110 (shown in FIG. 1) while the inverters 404 and 406 are powered by the voltage regulator 112 (shown in FIG. 1). As a result, when the voltage regulator 110 is adjusted to increase or decrease its supply voltage, the supply voltage to the inverters 402 and 408 change while the supply voltages to the inverters 404 and 406 are maintained. As a result of the change to the supply voltage, a DC offset between the outputs of the DC offset compensation circuit 204 is reduced, in certain embodiments.

For example, if there is a DC offset, the difference between $V_{3P}$ and $V_{3N}$ will be a non-zero voltage. A positive difference may cause an increase in the supply voltage to the inverters 402 and 408. This increase in the supply voltage causes an increase in $V_{2N}$ and $V_{3N}$. The increase in $V_{2N}$ results in a decrease in $V_{3P}$ due to the inverter 404 inverting $V_{2N}$. As a result, the difference between $V_{3P}$ and $V_{3N}$ decreases, which reduces or compensates for the DC offset over the output of the DC offset compensation circuit 204. If the difference between $V_{3P}$ and $V_{3N}$ is negative, then the supply voltage to the inverters 402 and 408 may be decreased. This decrease in the supply voltage causes a decrease in $V_{2N}$ and $V_{3N}$. The decrease in $V_{2N}$ causes an increase in $V_{3P}$ due to the inverter 404. As a result, the difference between $V_{3P}$ and $V_{3N}$ increases, which reduces or compensates for the DC offset over the output of the DC offset compensation circuit 204.

In some embodiments, an inverter 410 and a resistor 412 are connected in parallel to the output of the inverter 402. Additionally, a capacitor 414 is connected in series to the inverter 410 and the resistor 412. Moreover, an inverter 420 and a resistor 422 are connected in parallel to the output of the inverter 406. Additionally, a capacitor 424 is connected to the inverter 420 and the resistor 422. The inverter 410 is powered by the voltage regulator 110, and the inverter 420 is powered by the voltage regulator 112. Thus, adjustments to the supply voltage to the inverter 402 are also experienced by the inverter 410. Additionally, an inductor 418 is connected to the output of the inverter 404 and to an inverter 416. Additionally, an inductor 428 is connected to the output of the inverter 408 and an inverter 426. The inverter 416 is powered by the voltage regulator 112, and the inverter 426 is powered by the voltage regulator 110. As a result, adjustments to the supply voltage to the inverter 408 are also experienced by the inverter 426.

In certain embodiments, the DC offset compensation circuit 204 includes an inverter 430 and an inverter 432 connected in parallel with each other between the outputs of the inverters 402 and 406. The inverter 430 is directed to the output of the inverter 402 and the inverter 432 is directed towards the output of the inverter 406. The inverter 432 is powered by the voltage regulator 110, and the inverter 430 is powered by the voltage regulator 112. Thus, adjustments to the supply voltage to the inverter 402 are also experienced by the inverter 432. Additionally, the DC offset compensation circuit 204 includes an inverter 434 and an inverter 436 connected in parallel between the outputs of the inverters 404 and 408. The inverter 434 is directed to the output of the inverter 404, and the inverter 436 is directed to the output of the inverter 408. The inverter 434 is powered by the voltage regulator 110, and the inverter 436 is powered by the voltage regulator 112. As a result, adjustments to the supply voltage to the inverter 408 are also experienced by the inverter 434.

Figure 5:
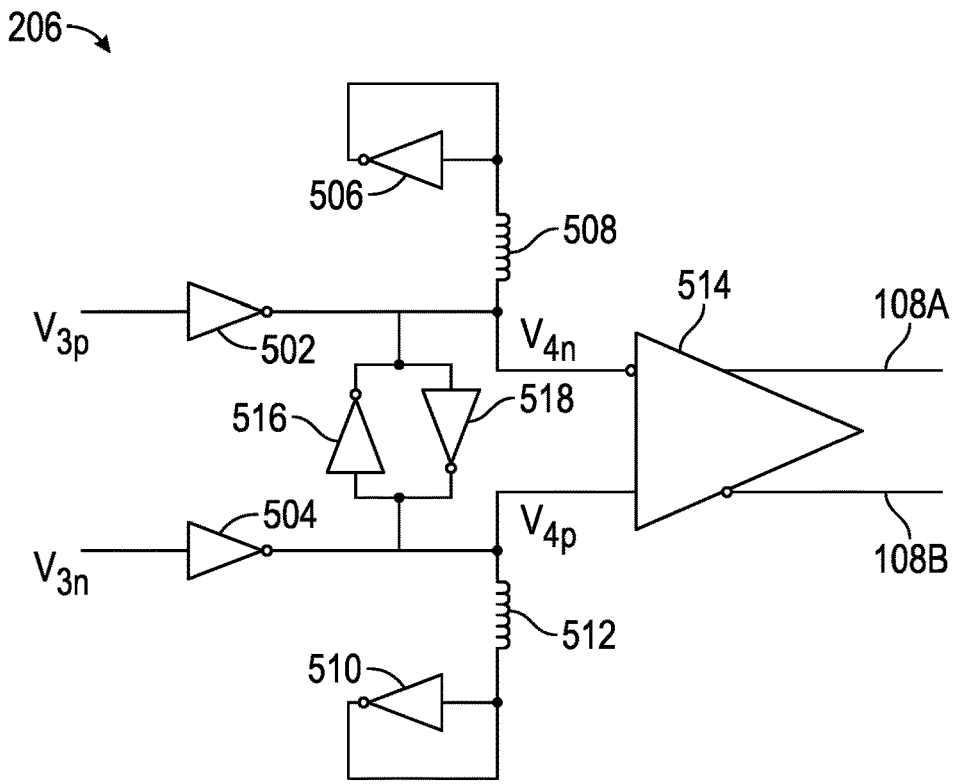
FIG. 5 illustrates an example output stage in the DTIA of FIG. 2.

FIG. 5 illustrates an example output stage 206 in the DTIA 104 of FIG. 2. As seen in FIG. 5, the output stage 206 includes an inverter 502 and an inverter 504 that receive the output of the DC offset compensation circuit 204. Specifically, the inverter 502 receives $V_{3P}$, and the inverter 504 receives $V_{3N}$. The inverters 502 and 504 invert and apply a gain to $V_{3P}$ and $V_{3N}$ to produce voltage signals labeled $V_{4N}$ and $V_{4P}$ in FIG. 5. The inverters 502 and 504 are powered by the voltage regulator 110. As a result, adjustments to the supply voltages to the inverters 402 and 408 shown in FIG. 4 are also experienced by the inverters 502 and 504. Because the inverters 502 and 504 are both powered by the voltage regulator 110, adjustments to the supply voltage from the voltage regulator 110 will equally affect $V_{4N}$ and $V_{4P}$.

The output stage 206 also includes an amplifier 514 that inverts and amplifies $V_{4N}$ and $V_{4P}$ to produce the output voltage of the DTIA 104 over the outputs 108A and 108B. In certain embodiments, because the DC offset compensation circuit 204 of the DTIA 104 reduces or compensates for a DC offset between $V_{3P}$ and $V_{3N}$, the amplifier 514 does not further amplify the DC offset to produce the output voltage of the DTIA 104.

In some embodiments, the output stage 206 includes an inductor 508 connected to the output of the inverter 502 and to another inverter 506. Additionally, the output stage 206 includes an inverter 512 connected to the output of the inverter 504 and to another inverter 510. The inverters 506 and 510 are powered by the voltage regulator 110. As a result, adjustments to the supply voltage to the inverters 502 and 504 are also experienced by the inverters 506 and 510. Additionally, the output stage 206 includes inverters 516 and 518 connected in parallel between the outputs of the inverters 502 and 504. The inverter 516 is directed towards the output of the inverter 502, and the inverter 518 is directed towards the output of the inverter 504. The inverters 516 and 518 are powered by the voltage regulator 110. As a result, adjustments to the supply voltage to the inverters 502 and 504 are also experienced by the inverters 516 and 518.

Figure 6:
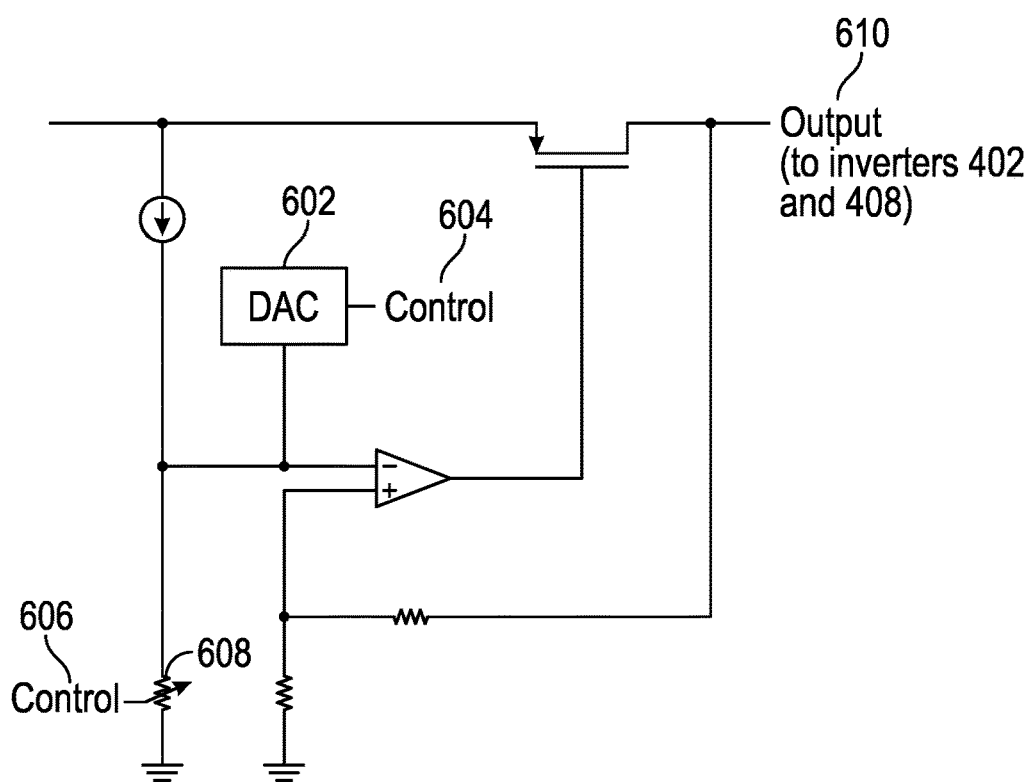
FIG. 6 illustrates an example voltage regulator in the system of FIG. 1.

FIG. 6 illustrates an example voltage regulator 110 in the system 100 of FIG. 1. As seen in FIG. 6, the voltage regulator 110 includes a digital to analog converter (DAC) 602 and a variable resistor 608. The DAC 602 and the variable resistor 608 are controlled to adjust a supply voltage over an output 610 of the voltage regulator 110.

The digital control 604 may be a digital control signal provided by the controller 114 shown in FIG. 1. In some examples, the control 604 includes nine bits that are used to adjust the DAC 602. For example, the control 604 may be adjusted to change an output current of the DAC 602. The DAC 602 effectively converts the digital control 604 to an analog electric current. Adjustments to the digital control 604 increase or decrease the electric current produced by the DAC 602 (e.g., in a range between 10 and 40 microAmps). As a result, the DAC 602 allows for fine tuning of the output supply voltage of the voltage regulator 110.

In some embodiments, the controller 114 adjusts the control 604 based on a DC offset detected in the DTIA 104 by the offset sensor 115. The controller 114 adjusts the control 604 to tune the output supply voltage of the voltage regulator 110. The change in the supply voltage of the voltage regulator 110 causes the DC offset compensation circuit 204 of the DTIA 104 shown in FIG. 2 to reduce or compensate for the DC offset (e.g., by adjusting the supply voltage to the inverters 402 and 408 shown in FIG. 4). In this manner, the DAC 602 changes the output supply voltage of the voltage regulator 110 to reduce or compensate for DC offset.

The variable resistor 608 has a variable resistance controlled by the digital control 606, which may be another digital control signal. In some embodiments, the controller 114 adjusts the digital control 606 to adjust the resistance of the variable resistor 608, which adjusts the output supply voltage of the voltage regulator 110. The digital control 606 may have fewer bits than the digital control 604. As a result, the variable resistor 608 provides course control of the output supply voltage of the voltage regulator 110. In some embodiments, the digital control 606 is a shared control signal used by both the voltage regulator 110 and the voltage regulator 112 shown in FIG. 1. As a result, the shared control signal controls both the voltage regulator 110 and the voltage regulator 112 and adjustments to the digital control 606 are experienced by both the voltage regulator 110 and the voltage regulator 112.

Figure 7:
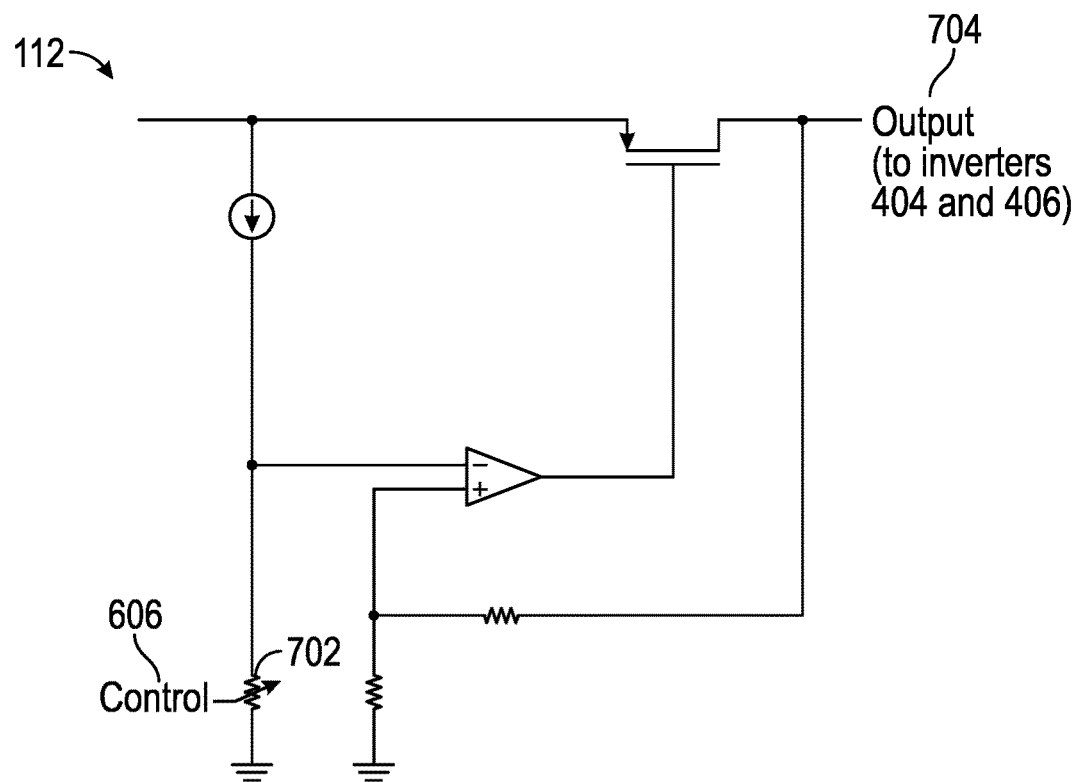
FIG. 7 illustrates an example voltage regulator in the system of FIG. 1.

FIG. 7 illustrates an example voltage regulator 112 in the system 100 of FIG. 1. As seen in FIG. 7, the voltage regulator 112 includes a variable resistor 702 that controls the output supply voltage of the voltage regulator 112 over the output 704. As discussed previously, the variable resistor 702 is controlled by the digital control 606 that is used to control the variable resistor 608 shown in FIG. 6. As a result, adjustments to the digital control 606 are experienced by both the voltage regulator 110 and the voltage regulator 112. Adjustments to the resistance of the variable resistor 702 adjust the output supply voltage of the voltage regulator 112 (e.g., to adjust the supply voltage to the inverters 404 and 406 shown in FIG. 4). In some embodiments, the output supply voltage of the voltage regulator 112 is maintained while the output supply voltage of the voltage regulator 110 is adjusted. For example, the output supply voltage of the voltage regulator 110 may be adjusted by changing the digital control 604 to the DAC 602 while maintaining the digital control 606.

Figure 8:
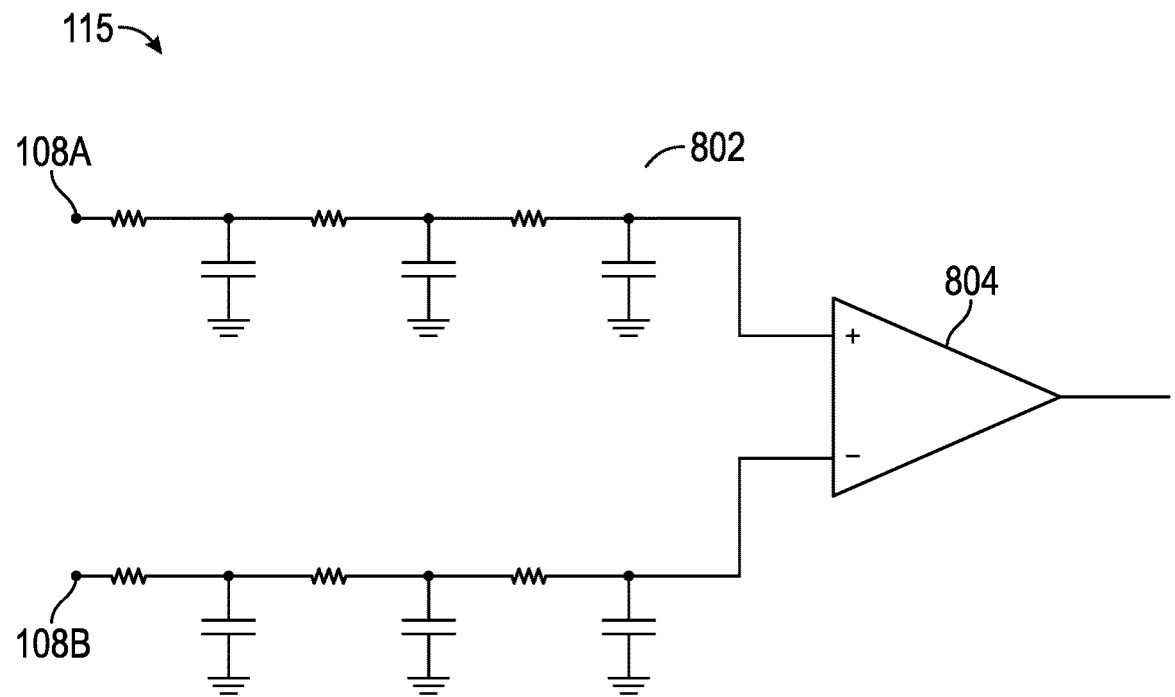
FIG. 8 illustrates an example offset sensor in the system of FIG. 1.

FIG. 8 illustrates an example offset sensor 115 in the system 100 of FIG. 1. As seen in FIG. 8, the offset sensor 115 includes a filter 802 and a comparator 804 that operate to detect a DC offset over the outputs 108A and 108B of the DTIA 104 shown in FIG. 1. The filter 802 includes a series of resistors and capacitors that filter the output signal (e.g., by forming a low pass filter). The comparator 804 determines a difference between the filtered signals, which is indicative of a DC offset. The controller 114 shown in FIG. 1 uses the detected DC offset to adjust the supply voltage of the voltage regulator 110.

Figure 9:
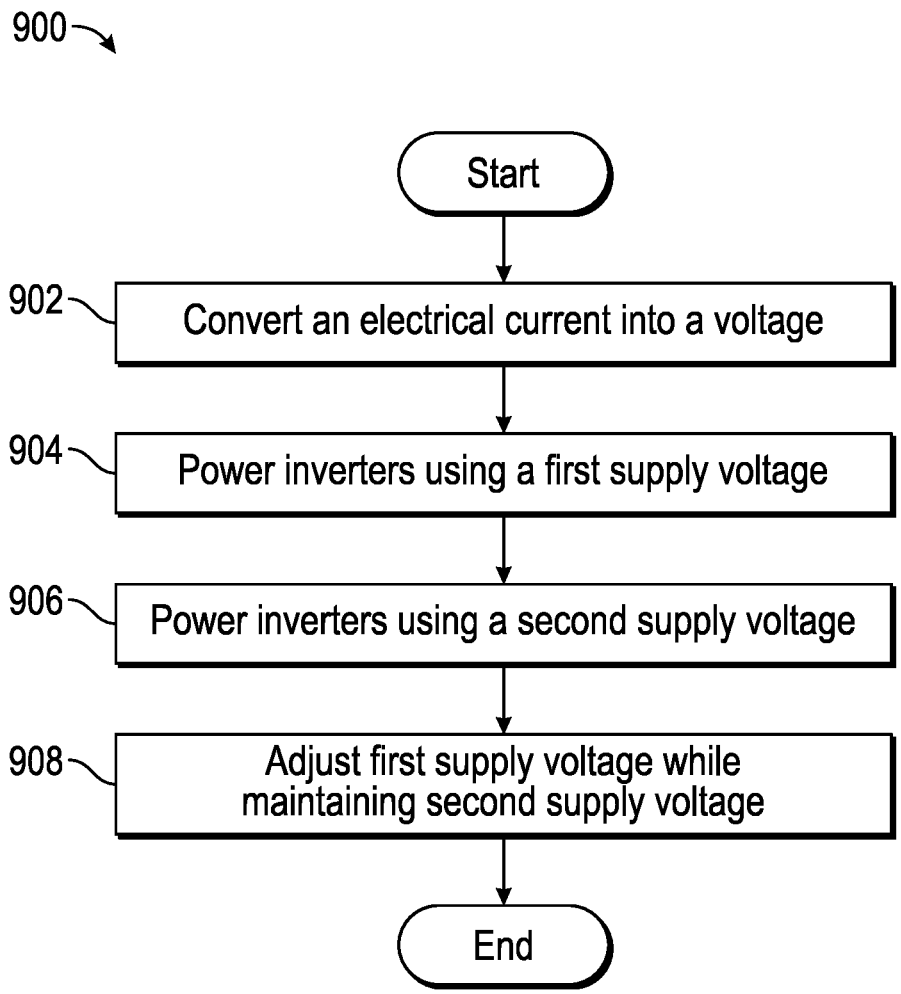
FIG. 9 is a flowchart of an example method performed in the system of FIG. 1.

FIG. 9 is a flowchart of an example method 900 performed in the system 100 of FIG. 1. Various components of the system 100 perform the method 900. By performing the method 900, a DC offset is compensated or reduced, in particular embodiments.

In block 902, a DTIA 104 converts an electrical current into a voltage. A photodiode 102 generates the electrical current based on an amount of light that enters the photodiode 102. The electrical current flows between the inputs 106A and 106B of the DTIA 104. An input stage 202 of the DTIA 104 converts the electrical current into a voltage. The input stage 202 then sends the voltage to a DC offset compensation circuit 204 in the DTIA 104.

In block 904, certain inverters in the DC offset compensation circuit 204 are powered using a first supply voltage from a voltage regulator 110. For example, the inverters 402 and 408 shown in FIG. 4 may be powered using the first supply voltage from the voltage regulator 110. In block 906, some inverters in the DC offset compensation circuit 204 are powered using a second supply voltage from a voltage regulator 112. For example, the inverters 404 and 406 shown in FIG. 4 may be powered using the second supply voltage.

In block 908, the controller 114 adjusts the first supply voltage from the voltage regulator 110 while maintaining the second supply voltage from the other voltage regulator 112. The controller 114 may determine the adjustment to the first supply voltage based on a detected DC offset in the output voltage of the DTIA 104. The offset sensor 115 may detect the DC offset in the output of the DTIA 104. The controller 114 determines adjustments to be made to a digital control 604 in the voltage regulator 110. The change in the digital control 604 adjusts a DAC 602 in the voltage regulator 110, which cause an adjustment to the supply voltage outputted by the voltage regulator 110. The adjustment to the supply voltage changes the outputs of the inverters in the DC offset compensation circuit 204 powered by that supply voltage.

For example, using the example of FIG. 4, if the inverters 402 and 408 are powered by the first supply voltage from the voltage regulator 110, then an adjustment to that supply voltage causes the output signals of the inverters 402 and 408 to change. If the supply voltage is increased, then $V_{2N}$ and $V_{3N}$ outputted by the inverters 402 and 408 increase. The increase in $V_{2N}$ causes $V_{3P}$ to decrease. The change in $V_{3P}$ and $V_{3N}$ reduces or compensates for a DC offset in the DTIA 104.

In summary, a DTIA 104 includes a DC offset compensation circuit 204 that uses series of inverters to reduce DC offset in the output of the DTIA 104. Specifically, a DAC controlled voltage regulator 110 adjusts its supply voltage to a portion of the inverters in the DTIA 104 to reduce the DC offset at the output. Meanwhile, the supply voltage to other inverters in the DTIA 104 are fixed. As a result, the DC offset in the output of the DTIA 104 is compensated while maintaining the bandwidth or gain of the DTIA 104, in certain embodiments In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. A differential transimpedance amplifier (DTIA) comprising:
a first input, a second input, a first output, and a second output;
a first inverter and a second inverter connected in series to the first input; and
a third inverter and a fourth inverter connected in series to the second input, wherein the first inverter and the fourth inverter are configured to receive a first supply voltage from a first voltage regulator, wherein the second inverter and the third inverter are configured to receive a second supply voltage from a second voltage regulator, and wherein the first supply voltage changes (i) based on a difference between voltages on the first output and the second output and (ii) while the second supply voltage remains fixed.

2. The DTIA of claim 1, further comprising:
a fifth inverter connected in series with the first inverter and the second inverter, wherein the fifth inverter is configured to receive the first supply voltage from the first voltage regulator; and
a sixth inverter connected in series with the third inverter and the fourth inverter, wherein the sixth inverter is configured to receive the first supply voltage from the first voltage regulator.

3. The DTIA of claim 1, further comprising:
a fifth inverter connected to an output of the first inverter, wherein the fifth inverter is configured to receive the first supply voltage from the first voltage regulator; and
a sixth inverter connected to an output of the fourth inverter, wherein the sixth inverter is configured to receive the first supply voltage from the first voltage regulator.

4. The DTIA of claim 1, further comprising an input stage, wherein an input of the first inverter and an input of the third inverter are connected to the input stage.

5. The DTIA of claim 1, further comprising a fifth inverter, wherein an input of the fifth inverter is connected to an output of the first inverter and an output of the fifth inverter is connected to an output of the third inverter, and wherein the fifth inverter is configured to receive the first supply voltage from the first voltage regulator.

6. The DTIA of claim 1, wherein the first voltage regulator comprises a digital-to-analog converter that changes the first supply voltage based on a received digital signal.

7. The DTIA of claim 1, wherein the first voltage regulator comprises a first resistor, wherein the second voltage regulator comprises a second resistor, and wherein a resistance of the first resistor and a resistance of the second resistor are adjusted based on a shared control signal.

8. The DTIA of claim 1, wherein the difference between the voltages on the first output and the second output comprises a direct current (DC) offset and wherein the first supply voltage changes to reduce the DC offset.

9. A method comprising:
converting an electrical current over a first input and a second input of a differential transimpedance amplifier (DTIA) into a voltage over a first output and a second output of the DTIA, wherein the DTIA comprises a first inverter and a second inverter connected in series to the first input and a third inverter and a fourth inverter connected in series to the second input;
powering the first inverter and the fourth inverter using a first supply voltage from a first voltage regulator; and
powering the second inverter and the third inverter using a second supply voltage from a second voltage regulator, wherein the first supply voltage changes (i) based on a difference between voltages on the first output and the second output and (ii) while the second supply voltage remains fixed.

10. The method of claim 9, further comprising:
powering, using the first supply voltage from the first voltage regulator, a fifth inverter connected in series with the first inverter and the second inverter; and
powering, using the first supply voltage from the first voltage regulator, a sixth inverter connected in series with the third inverter and the fourth inverter.

11. The method of claim 9, further comprising:
powering, using the first supply voltage from the first voltage regulator, a fifth inverter connected to an output of the first inverter; and
powering, using the first supply voltage from the first voltage regulator, a sixth inverter connected to an output of the fourth inverter.

12. The method of claim 9, wherein an input of the first inverter and an input of the third inverter are connected to an input stage.

13. The method of claim 9, powering a fifth inverter using the first supply voltage from the first voltage regulator, wherein an input of the fifth inverter is connected to an output of the first inverter and an output of the fifth inverter is connected to an output of the third inverter.

14. The method of claim 9, further comprising changing the first supply voltage based on a received digital signal and using a digital-to-analog converter.

15. The method of claim 9, adjusting, based on a shared control signal, a resistance of a first resistor of the first voltage regulator and a resistance of a second resistor of the second voltage regulator.

16. The method of claim 9, wherein the voltage over the first output and the second output comprises a direct current (DC) offset and wherein the first supply voltage changes to reduce the DC offset.

17. A differential transimpedance amplifier (DTIA) comprising:
a first inverter and a second inverter connected in series; and
a third inverter and a fourth inverter connected in series, wherein the first inverter and the fourth inverter are configured to receive a first supply voltage, wherein the second inverter and the third inverter are configured to receive a second supply voltage, and wherein the first supply voltage changes based on an output voltage of the DTIA while the second supply voltage remains fixed.

18. The DTIA of claim 17, further comprising:
a fifth inverter connected in series with the first inverter and the second inverter, wherein the fifth inverter is configured to receive the first supply voltage; and
a sixth inverter connected in series with the third inverter and the fourth inverter, wherein the sixth inverter is configured to receive the first supply voltage.

19. The DTIA of claim 17, further comprising:
a fifth inverter connected to an output of the first inverter, wherein the fifth inverter is configured to receive the first supply voltage; and
a sixth inverter connected to an output of the fourth inverter, wherein the sixth inverter is configured to receive the first supply voltage.

20. The DTIA of claim 17, further comprising a fifth inverter, wherein an input of the fifth inverter is connected to an output of the first inverter and an output of the fifth inverter is connected to an output of the third inverter, and wherein the fifth inverter is configured to receive the first supply voltage.

* * * * *